(12) United States Patent
Sehdev et al.

(10) Patent No.: US 6,271,668 B1
(45) Date of Patent: Aug. 7, 2001

(54) TESTING ELECTRICAL INSTALLATIONS

(75) Inventors: Arun Sehdev, Hertfordshire; Martin Litherland, Marlborough, both of (GB)

(73) Assignee: Robin Electronics Limited, Hertfordshire (GB)

( * ) Notice: Subject to any disclaimer, the term of this patent is extended or adjusted under 35 U.S.C. 154(b) by 0 days.

(21) Appl. No.: 09/155,500

(22) PCT Filed: Mar. 26, 1997

(86) PCT No.: PCT/GB97/00869

§ 371 Date: Jan. 7, 1999

§ 102(e) Date: Jan. 7, 1999

(87) PCT Pub. No.: WO97/37237

PCT Pub. Date: Oct. 9, 1997

(30) Foreign Application Priority Data

Mar. 29, 1996 (GB) ................................................ 9606751

(51) Int. Cl.$^7$ .................................................. G01R 31/02
(52) U.S. Cl. ............................................. 324/529; 324/710
(58) Field of Search .................................. 324/710, 508, 324/529, 66, 525, 642

(56) References Cited

U.S. PATENT DOCUMENTS

| | | | |
|---|---|---|---|
| 3,576,490 | * | 4/1971 | Nishino ................................ 324/642 |
| 3,662,219 | * | 5/1972 | Knoxx ................................... 361/68 |
| 4,005,363 | * | 1/1977 | Mifflin ............................. 324/58.5 B |
| 4,481,464 | * | 11/1984 | Noguchi et al. ...................... 324/658 |
| 4,484,131 | * | 11/1984 | Jenkinson ............................. 324/533 |
| 4,810,950 | * | 3/1989 | Young ............................... 324/57 PS |
| 4,906,938 | * | 3/1990 | Konopka .............................. 324/529 |
| 5,352,985 | * | 10/1994 | Simon ................................. 324/716 |
| 5,402,073 | * | 3/1995 | Ross .................................... 324/539 |
| 5,497,094 | * | 3/1996 | George ................................. 324/529 |
| 5,969,516 | * | 10/1999 | Wottrich ................................. 324/67 |

* cited by examiner

*Primary Examiner*—Safet Metjahic
*Assistant Examiner*—Vincent Q. Nguyen
(74) *Attorney, Agent, or Firm*—Fay, Sharpe, Fagan, Minnich & McKee, LLP

(57) ABSTRACT

A main circuit loop tester includes a wave form generator for producing a current pulse in the form of a narrow spike. The wave form generator is connected to a power stage for producing a high amplitude output. The loop tester also includes a high frequency generator adapted to produce groups of low current pulses at high frequency. A measuring circuit is adapted to measure the resistive and reactive components of the resulting output signals from the main circuit. The tester is particularly useful for testing electrical installations which include residual current devices.

16 Claims, 3 Drawing Sheets

TESTING ELECTRICAL INSTALLATIONS

BACKGROUND

This invention relates to the testing of electrical installations and in particular, to the testing of such installations which include residual current devices (RCDs).

To ensure the safety of an electrical installation a measurement is made of the impedance between the live or phase terminal and earth at various points: this test is commonly known as a 'loop test'. Traditionally the loop test applies a load between live and earth such that a high current flows for a relatively short period of time (typically 25A according to International standards). The voltage drop due to the current is used to calculate the loop impedance.

Installations often include a residual current device (RCD) to detect a fault current flowing to earth by sensing an imbalance in the live and neutral currents flowing to the installation. An imbalance above a set level causes the RCD to 'trip', and disconnect the mains to the installation.

A loop test applied on the load side of an RCD applies a large current imbalance which trips the RCD. The loop test therefore cannot be completed and there may also be inconvenience to users as the mains supply fails.

EP-A-0295880(Robin Electronics) describes a method of testing which prevents an RCO from tripping while a standard loop rest is carried out. However newer RCD designs are susceptible to tripping even using this method.

Accordingly the present invention seeks to provide a method of performing a loop test without tripping RCDS.

SUMMARY OF THE INVENTION

According to a first aspect of the invention, there is provided a method of carrying out a loop test of a mains circuit which comprises applying a narrow pulse of a high peak value (for example 25A peak) in order to measure small loop impedances accurately by maximising the voltage drop during the pulse.

RCD designs include filter circuitry to prevent 'nuisance tripping' which would otherwise occur when a noise transient appears on the mains supply, for example when equipment is switched on. Accordingly, the width of the pulse is chosen to be not long enough for-an RCD to trip. Also, the shape of the pulse is such that the RCD circuitry is least likely to be sensitive to it.

Several pulses may be applied in order to complete the loop test measurement to the required accuracy. The interval between the pulses is designed to be long enough for the FCD to settle to its noqminal state, before the next pulse is applied.

Because a short pulse is used, the reactance in the system (typically the inductance of the substation transformer supplying the mains) can have a large effect on the test result.

According to a second aspect of the invention there is provided a method of carrying out a loop of a mains circuit test in which a signal of relatively low amplitude but containing high frequencies is injected into the circuit.

This signal contains frequencies significantly higher than mains frequency, for example audio frequencies of up to 10 kHz, which can thus easily be detected in the presence of mains. Also, higher frequencies produce larger phase shifts in the reactive component thus easing the measurement.

The signal is preferably applied for a number of successive cycles allowing transients in the system to decay then the phase angle of the signals voltage and current can be measured. Thus the method allows the resistive and reactive components of the loop impedance to be calculated.

Because timing is critical in this method, a digital circuit (which may include a microprocessor) is used to control the instrument. Depending on the test circumstances either or both of the above methods may be used. The instrument displays either the magnitude of the loop impedance, with or without the phase angle, or may display the resistive and reactive components separately or may display a fail/pass indication against a set level.

In addition to, or instead of, this the instrument may display prospective short circuit current, which is the current that would flow through a short circuit fault between live and earth at the time of the test.

It will therefore be understood that the invention also extends to a two-stage method of testing an installation in which one stage comprises applying a narrow pulse of a high peak value, and the other stage comprises injecting a high frequency, low amplitude signal, to enable the measurement of both resistive and reactive components of impedance.

BRIEF DESCRIPTION OF THE DRAWINGS

Some embodiments of the invention will now be described by way of example with reference to the accompanying drawings in which.

DESCRIPTION OF THE PREFERRED EMBODIMENTS

Figure 1:
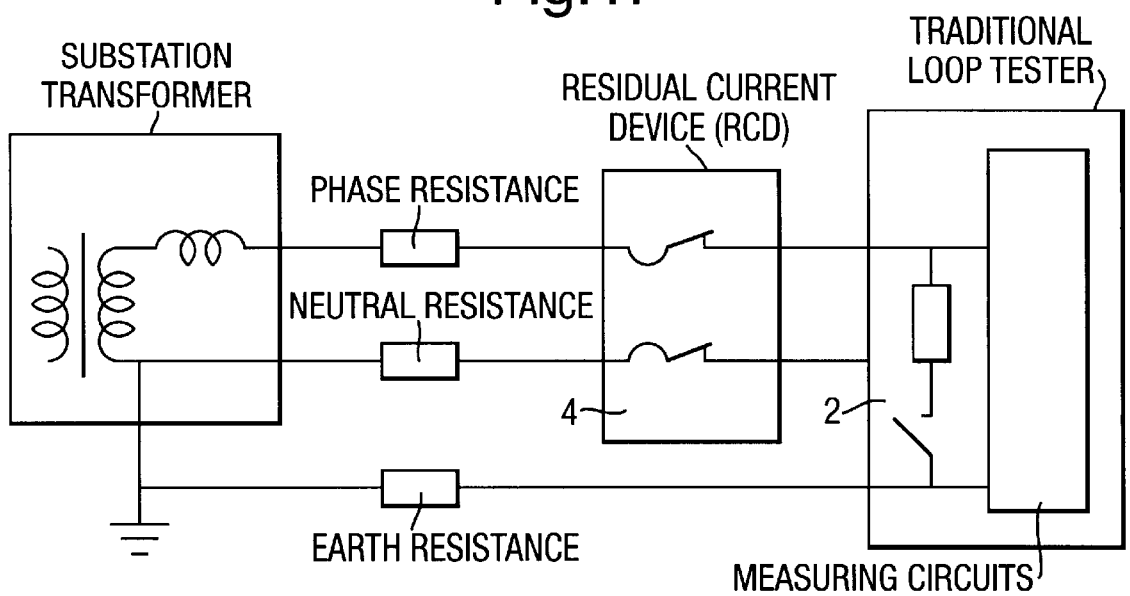
FIG. 1 is a schematic block diagram of a conventional loop testing arrangement.
Figure 2:
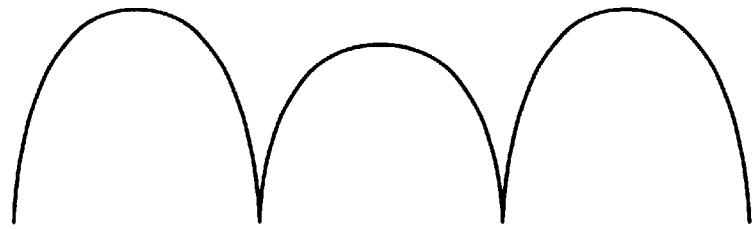
FIG. 2 shows the waveform of phase to earth voltage during a test pulse in FIG. 1.
Figure 3:
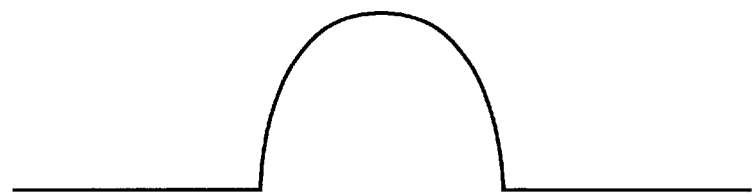
FIG. 3 shows a waveform of phase to earth current during the test pulse of FIG. 1.

Referring to the drawings, the traditional loop tester 2 of FIG. 1 produces a test pulse (FIG. 3) which is typically one half cycle at 25 amps, through the phase to earth loop of FIG. 1. This produces a phase to earth voltage signal, FIG. 2, which is measured in order to determine the loop resistance. When an RCD device 4 is incorporated in the circuit, the current imbalance trips the RCD, and therefore makes it difficult to complete the loop test.

Figure 4:
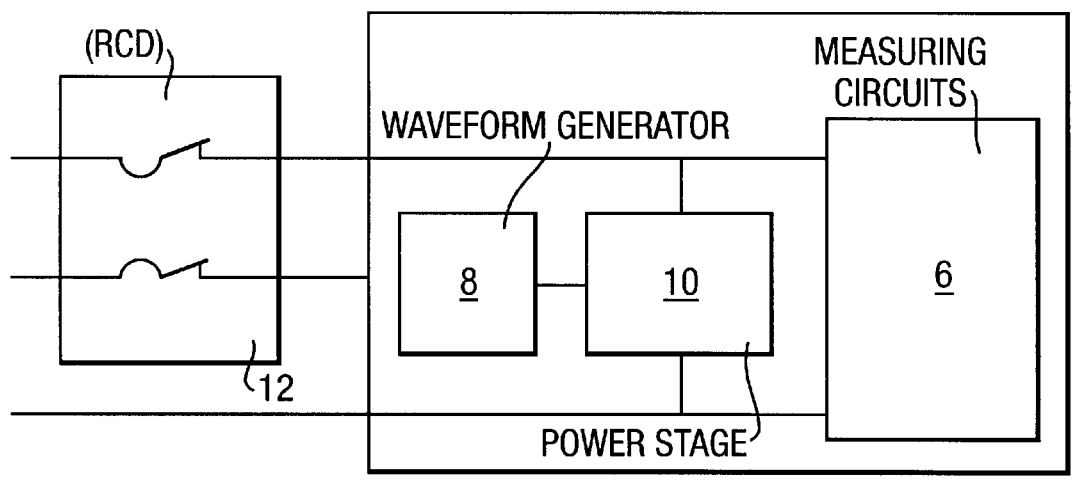
FIG. 4 is a circuit diagram of a first type of loop tester in accordance with the present invention.
Figure 5:
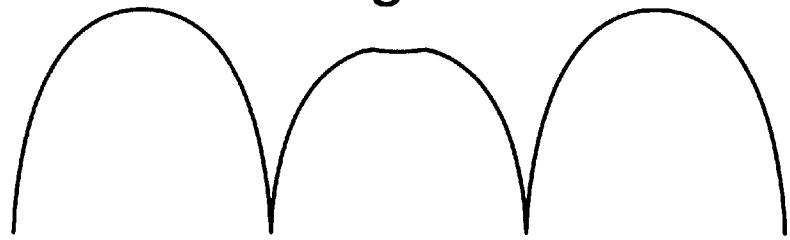
FIG. 5 is a waveform diagram of phase to earth voltage during a test pulse in the circuit of FIG. 4.
Figure 6:
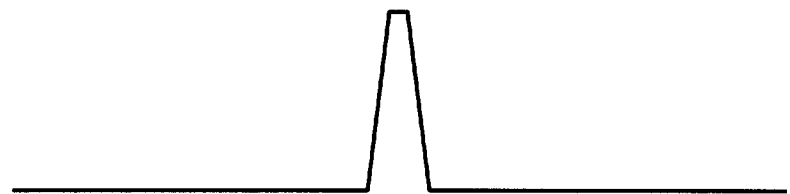
FIG. 6 is a waveform diagram of phase to earth current during a test pulse in the circuit of FIG. 4.

Referring to FIG. 4, a first type of loop tester according to the invention comprises measuring circuits 6, a waveform generator a, and a power stage 10. These produce a phase to earth current pulse in the form of a narrow "spike", as illustrated in FIG. 6, which is of a high amplitude, such as 25 amps, but the pulse is arranged to be of such a shape that it does not trip an RCD 12 included in the circuit under test. Once again, the phase to earth voltage drop, illustrated in FIG. 5, can be used to measure the resistive component of impedance in the circuit under test.

Figure 7:
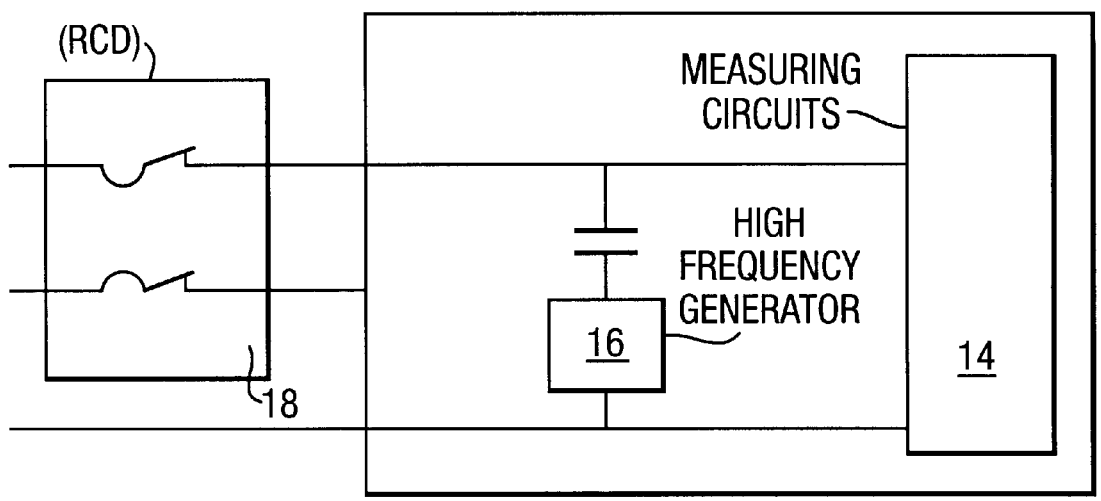
FIG. 7 is a schematic block diagram of a second form of loop tester in accordance with the present invention.
Figure 8:
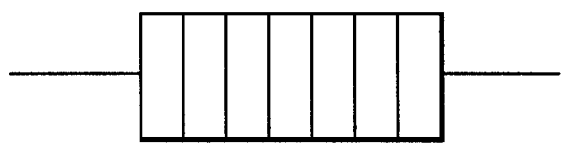
FIG. 8 is a schematic diagram of an HF current waveform produced as a circuit of FIG. 7.

The general type of circuit arrangement used in the second form of loop tester in accordance with the invention is illustrated in FIG. 7. Once again, measuring circuits 14 are connected to measure the phase to earth voltage generated by the test, but in this case, a small current (e.g. several milliamps) is injected by means of a high frequency generator 16, in a rapid series of bursts as illustrated in FIG. 8. Because of the high frequency, which may be an audio frequency up to (say) 10 kHz, the RCD 18 incorporated in the circuit does not react, and this enables the reactive component of the loop impedance to be determined, from the phase difference between the injected current, and the measured voltage signal.

What is claimed is:

1. A method of carrying out a loop test of a mains circuit having a residual current device, the method comprising:
    (a) applying a pulse to the mains circuit so as not to trip the residual current device, said pulse having a high peak current and a duration shorter than required to trip the residual current device;
    (b) measuring a voltage drop during the pulse; and,
    (c) calculating loop impedance as a function of the voltage drop.

2. The method according to claim 1, wherein a series of pulses are applied to the circuit at sufficiently long intervals to allow the residual current device to settle to its nominal state between pulses.

3. The method according to claim 1, wherein the peak current is approximately 25 A or higher.

4. The method according to claim 1, wherein the peak current is of sufficient magnitude to otherwise trip the residual current device but for the pulse having a sufficiently short duration so that the residual current device is not tripped.

5. The method according to claim 1, wherein the peak current is high relative to that which would otherwise trip the residual current device.

6. A method of carrying out a loop test of a mains circuit including a residual current device, the method including the steps of:
    (a) applying a signal to the mains circuit being tested, said signal including a number of narrow pulses of high peak current value, wherein successive pulses are separated by sufficiently long intervals such that the residual current device is allowed to settle between pulses; and,
    (b) injecting a signal of low amplitude that contains frequencies significantly higher than a mains frequency so that an output signal is distinguishable from the mains frequency;
    whereby both resistive and reactive components of impedance are measurable.

7. A mains circuit loop tester comprising a waveform generator, for producing a current pulse in the form of a narrow spike so as not to trip a residual current device; a power stage for producing a high amplitude output; and measuring circuitry for measuring the resistive component of loop impedance as a function of an output signal from the mains circuit.

8. A main circuit loop tester including a high frequency generator adapted to produce groups of low current pulses at high frequency so as not to trip a residual current device, and measuring circuitry for measuring the reactive component of loop impedance as a function of an output signal from the main circuit.

9. A main circuit loop tester including a waveform generator for producing a current pulse in the form of a narrow spike so as not to trip a residual current device, which is connected to a power stage for producing a high amplitude output; a high frequency generator adapted to produce groups of low current pulses at high frequency; and measuring circuitry adapted to measure the resistive and reactive components of the resultant output signals from the mains circuit.

10. A method of carrying out a loop test of mains circuit including a residual current device, the method comprising:
    (a) applying a signal of low amplitude containing frequencies significantly higher than a mains frequency so as not to trip the residual current device, where by an output signal is detectable in the presence of the mains frequency; and,
    (b) determining an impedance component of the mains circuit based on the output signal.

11. The method according to claim 11, wherein the signal is applied for a number of successive cycles so as to allow transients in the system to decay, and thus to allow voltage and current phase angles of the signal to be measured.

12. A method of carrying out a loop test of a mains circuit including a residual current device, in accordance with claim 11, in which said frequencies include audio frequencies.

13. The method of carrying out a loop test in accordance with claim 10, wherein the signal applied includes frequencies in the audio range.

14. The method according to claim 10, wherein the determined impedance component is a reactive impedance component.

15. The method according to claim 10, wherein the impedance component is determined from a phase difference between the applied signal current and the output signal voltage.

16. A method of measuring loop impedance for a mains circuit having a residual current device, the method comprising the steps of:
    (a) applying two signal components to the mains circuit so as not to trip the residual current device, said two signal components including: a first signal component having one or more current pulses of sufficient amplitude to otherwise trip the residual current device but for the pulses being of sufficiently short duration and sufficiently spaced apart in time, and a second signal component having an amplitude insufficient to trip the residual current device and having a frequency substantially higher than a frequency of the mains circuit such that an output signal resulting therefrom is detectable in the presence of the mains frequency; and,
    (b) determining both a resistive component and a reactive component of the loop impedance for the mains circuit from output signals responsive to the two applied signal components.

\* \* \* \* \*